United States Patent
Bchir

(10) Patent No.: US 8,368,232 B2
(45) Date of Patent: Feb. 5, 2013

(54) SACRIFICIAL MATERIAL TO FACILITATE THIN DIE ATTACH

(75) Inventor: Omar J. Bchir, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 204 days.

(21) Appl. No.: 12/731,526

(22) Filed: Mar. 25, 2010

(65) Prior Publication Data

US 2011/0233790 A1    Sep. 29, 2011

(51) Int. Cl.
*H01L 23/52* (2006.01)
*H01L 23/48* (2006.01)
*H01L 29/40* (2006.01)

(52) U.S. Cl. ........... 257/778; 257/E21.499; 257/704; 257/706; 257/782; 438/108; 438/612; 438/614

(58) Field of Classification Search ........... 257/E21.499, 257/E21.502, E23.141, 632, 678, 704, 706, 257/773, 777, 778, 782, 783, 787; 438/106–109, 438/112, 113, 460, 464, 612, 614
See application file for complete search history.

(56) References Cited

U.S. PATENT DOCUMENTS

| | | | |
|---|---|---|---|
| 6,175,162 B1 * | 1/2001 | Kao et al. | 257/787 |
| 6,946,325 B2 * | 9/2005 | Yean et al. | 438/112 |
| 6,956,283 B1 | 10/2005 | Peterson | |
| 7,015,064 B1 * | 3/2006 | Patwardhan et al. | 438/106 |
| 7,135,385 B1 * | 11/2006 | Patwardhan et al. | 438/464 |
| 7,491,625 B2 * | 2/2009 | Bayan et al. | 438/460 |
| 7,595,226 B2 * | 9/2009 | Lytle et al. | 438/113 |
| 7,749,882 B2 * | 7/2010 | Kweon et al. | 438/597 |
| 7,830,017 B2 * | 11/2010 | Lee et al. | 257/773 |
| 8,048,781 B2 * | 11/2011 | How | 438/464 |
| 8,110,440 B2 * | 2/2012 | Bathan et al. | 438/109 |

(Continued)

FOREIGN PATENT DOCUMENTS

| EP | 2136394 A1 | 12/2009 |
|---|---|---|
| JP | 6244243 A | 9/1994 |

(Continued)

OTHER PUBLICATIONS

Fabrication of Microchannels using Polycarbonates as Sacrificial Materials, Reed, White, Rao, Allen, Henderson and Kohl, School of Chemical Engineering, Georgia Institute of Technology, 778 Atlantic Drive, Atlanta, GA 30332-0100, USA, Received Jul. 31, 2001, Published Oct. 12, 2001, Online at stacks.iop.org/JMM/11/733.

(Continued)

*Primary Examiner* — Chris Chu
(74) *Attorney, Agent, or Firm* — Michelle Gallardo; Nicholas J. Pauley; Jonathan T. Velasco

(57) ABSTRACT

A sacrificial material applied to a thin die prior to die attach provides stability to the thin die and inhibits warpage of the thin die as heat is applied to the die and substrate during die attach. The sacrificial material may be a material that sublimates at a temperature near the reflow temperature of interconnects on the thin die. A die attach process deposits the sacrificial material on the die, attaches the die to a substrate, and applies a first temperature to reflow the interconnects. At the first temperature, the sacrificial material maintains substantially the same thickness. A second temperature is applied to sublimate the sacrificial material leaving a clean surface for the later packaging processes. Examples of the sacrificial material include polypropylene carbonate and polyethylene carbonate.

20 Claims, 8 Drawing Sheets

U.S. PATENT DOCUMENTS

| | | | |
|---|---|---|---|
| 2002/0074637 A1 | 6/2002 | McFarland | |
| 2003/0124769 A1 | 7/2003 | Dotta et al. | |
| 2004/0065964 A1* | 4/2004 | Lee et al. | 257/783 |
| 2004/0113283 A1* | 6/2004 | Farnworth et al. | 257/782 |
| 2007/0077728 A1 | 4/2007 | Kulkarni et al. | |
| 2007/0270536 A1* | 11/2007 | Sachdev et al. | 524/440 |
| 2008/0003780 A1* | 1/2008 | Sun et al. | 438/464 |
| 2008/0093424 A1 | 4/2008 | Kumar et al. | |
| 2009/0085228 A1 | 4/2009 | Sun et al. | |
| 2009/0218671 A1 | 9/2009 | Kuwabara | |

FOREIGN PATENT DOCUMENTS

| | | |
|---|---|---|
| JP | 2004063516 A | 2/2004 |
| WO | WO2005093829 A1 | 10/2005 |

OTHER PUBLICATIONS

Empower Materials Inc.: "QPAC(R) Binders/Sacrificial Materials for High Quality Products", May 9, 2008, XP55014033, Retrieved from the Internet: URL:http://web.archive.org/web/20080509184403/http://www.empowermaterials.com/products/ [retrieved on Dec. 6, 2011].

International Search Report and Written Opinion—PCT/US2011/029975—ISA/EPO—Dec. 27, 2011.

Air Products., "QPAC ™ Copolymers. Polyalkylene Carbonates—A New Generation of Thermoplastics Based on CO 2 and Epoxides", 1991, Retrieved from the Internet: URL:http:// legacy.library.ucsf.edu/documentStore/n/c/n/ncn33a00/Sncn33a00.pdf.

Chen X et al., "Poly (ethylene carbonate) as Low Temperature Decomposition and High Oxygen Barrier Packaging Material", Tappi Polymers, Laminations & Coatings Conference, Aug. 22-26, 1999, Atlanta: Tappi Press, ISBN: 0-89852-739-2, pp. 649-654.

Honig R E., "A Fairy Tale: Vapor Pressure Data of the Elements", posted on Jul. 31, 2006, Retrieved from the Internet: URL:http://www.fusor.net/board/view.php"bn=fusor_vacuum&key=1154385640.

Liu B et al., "Thermal Degradation Kinetics of Poly (propylene carbonate) Obtained from the Copolymerization of Carbon Dioxide and Propylene Oxide", 2003, Journal of Applied Science, vol. 90, No. 4, pp. 947-953.

Luinstra G.,"Poly (Propylene Carbonate), Old Copolymers of Propylene Oxide and Carbon Dioxide with New Interests: Catalysis and Material Properties", 2008, Polymer Reviews, vol. 48, No. 1, pp. 192-219.

Wikipedia: "Ethylene carbonate", Feb. 19, 2010, Retrieved from the Internet: URL:http:// en.wikipedia.org/ w/ index.php"title=Ethylene_carbonate&oldid=344981332.

Wikipedia: "Solder", Mar. 23, 2010, Retrieved from the Internet: URL: http://en.wikipedia.org/w/index.php"title=Solder&oldid=351544086.

Wikipedia: "Sublimation (phase transition)", Mar. 21, 2010, Retrieved from the Internet: URL: http://en.wikipedia.org/w/index.php"title=Sublimation_%28phase_transition%29&oldid=351146842.

Yan H et al: "Thermal Decomposition Behaviour of Poly (propylene carbonate)", 1998, Ceramics International, vol. 24, No. 6, pp. 433-439.

* cited by examiner

SACRIFICIAL MATERIAL TO FACILITATE THIN DIE ATTACH

TECHNICAL FIELD

The present disclosure generally relates to integrated circuits. More specifically, the present disclosure relates to packaging integrated circuits.

BACKGROUND

Electronic devices are continually shrinking in size to improve portability of the electronic devices. For example, cellular telephones have recently decreased in size to fit in shirt pockets, and are continuing to decrease in size. As the devices shrink, the components inside the device, including the integrated circuits, also shrink. In integrated circuits, a significant amount of the overall thickness is the die rather than circuitry on the die. One method of decreasing the integrated circuit thickness uses thinner dies for the integrated circuits.

Thin dies are fragile and difficult to handle during manufacturing processes. For example, when heating a thin die during reflow, unbalanced stresses in the die cause the die to warp. Warpage results in poor contact between interconnects (e.g., non-wets) leading to yield and reliability problems at die thicknesses less than 100 micrometers. A conventional die attach process having wafer warpage is illustrated in FIGS. 1A-1B.

FIG. 1A is a cross-sectional view illustrating a conventional packaged integrated circuit before heating. A die 120 with interconnects 122 is coupled to a substrate 102 having interconnects 110. The interconnects 122 are attached to the interconnects 110 through a flux material 112. The die 120 and the substrate 102 are heated to reflow the interconnects 122 and the interconnects 110 and bond the interconnects 122 with the interconnects 110.

FIG. 1B is a cross-sectional view illustrating a conventional packaged integrated circuit after heating. During heating, the die 120 may warp due to unbalanced stresses. Warpage at edges of the die 120 is larger than the center of the die 120. As a result, connections 130 are created between the interconnects 122 and the interconnects 110 in the center of the die 120. However, non-wets 132 occur between the interconnects 122 and the interconnects 110 at the edges of the die 120.

The non-wets 132 reduce yield and reliability of integrated circuits manufactured that include the die 120. Thus, there is a need for an improved method of attaching thin dies during manufacturing of integrated circuits.

BRIEF SUMMARY

According to one aspect of the disclosure, a method of packaging includes depositing a sacrificial material on a die. The method also includes attaching a first group of interconnects of the die to a second group of interconnects of a substrate after depositing the sacrificial material on the die. The method further includes heating the die to a first temperature after depositing the sacrificial material. The first temperature causing the first group of interconnects of the die to connect to the second group of interconnects of the substrate. The method also includes heating the die to a second temperature after heating the die to the first temperature. The second temperature causes the sacrificial material to sublime.

According to another aspect of the disclosure, a method of packaging includes the step of depositing a sacrificial material on a die. The method also includes the step of attaching a first group of interconnects of the die to a second group of interconnects of a substrate after depositing the sacrificial material on the die. The method further includes the step of heating the die to a first temperature after depositing the sacrificial material. The first temperature causing the first group of interconnects on the die to connect to the second group of interconnects on the substrate. The method also includes the step of heating the die to a second temperature after heating the die to the first temperature. The second temperature causing the sacrificial material to sublimate.

According to a further aspect of the disclosure, an apparatus includes a substrate having a first group of interconnects. The apparatus also includes a die having a second group of interconnects attached to the first group of interconnects. The apparatus further includes a sacrificial layer on a side of the die opposite the second group of interconnects. The sacrificial layer has a sublimation temperature above the liquidus temperature of the second group of interconnects.

According to another aspect of the disclosure, an apparatus includes a substrate having a first group of interconnects. The apparatus also includes a die having a second group of interconnects attached to the first group of interconnects. The apparatus further includes means for reducing warpage on a side of the die opposite the second group of interconnects. The warpage reducing means has a sublimation temperature above the liquidus temperature of the second group of interconnects.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Depositing a sacrificial material during packaging of an integrated circuit (IC) with a thin die temporarily increases the thickness of the thin die to provide additional support for the die. For example, during solder reflow high temperatures applied to a die may cause warpage of a die having a thickness below 100 micrometers. A sacrificial material may be deposited on the thin die before stacking on a substrate and before application of high temperatures in order to inhibit warpage of the die during reflow. The sacrificial material may be used in packaging techniques such as face-to-face die bonding or other technologies in which contacts of the die are facing the substrate or printed circuit board.

Figure 1A:
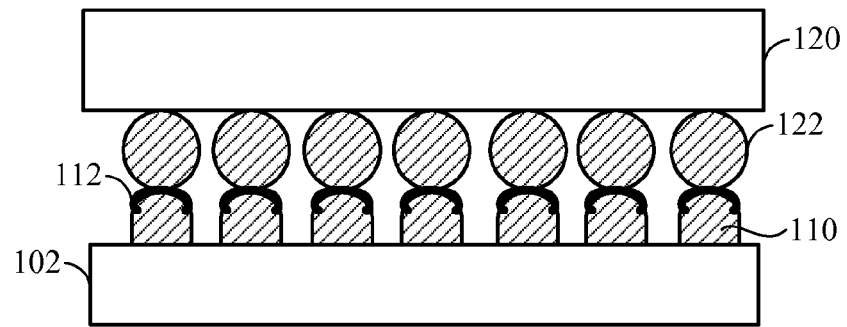
FIG. 1A is a cross-sectional view illustrating a conventional packaged integrated circuit before heating for die attach.
Figure 1B:
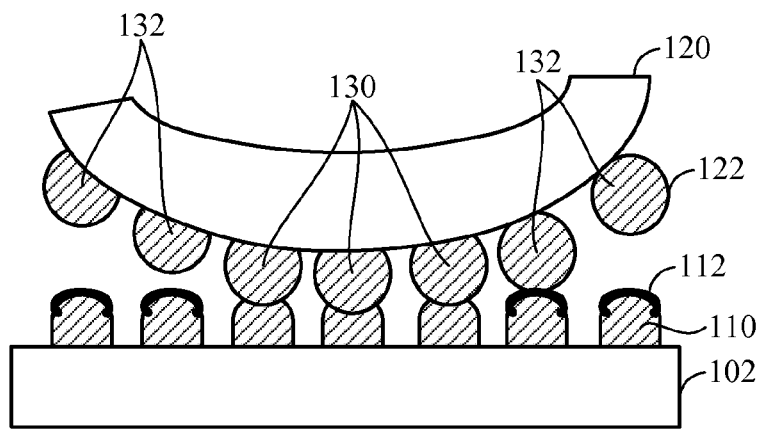
FIG. 1B is a cross-sectional view illustrating a conventional packaged integrated circuit after heating for die attach.
Figure 2:
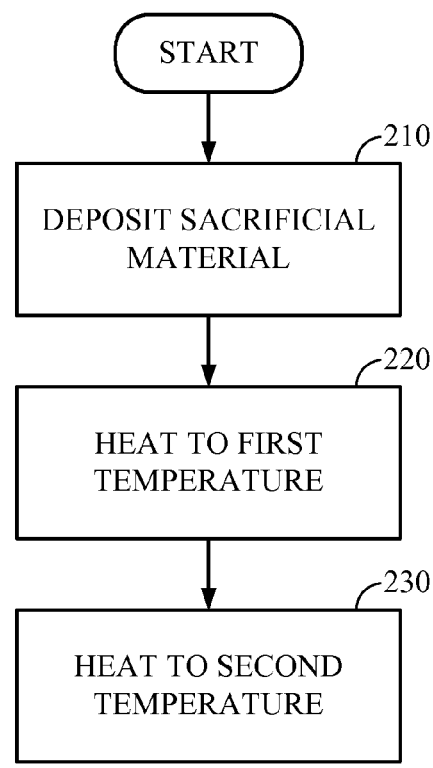
FIG. 2 is a flow chart illustrating an exemplary process flow for die attach with thin dies according to one embodiment.
Figure 3A:
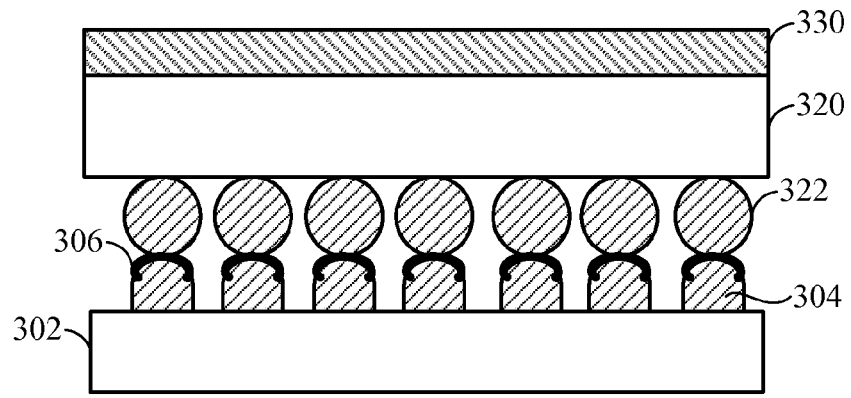
FIG. 3A is a cross-sectional view illustrating an exemplary die after deposition of a sacrificial material according to one embodiment.

FIG. 2 is a flow chart illustrating an exemplary process flow for die attach with thin dies according to one embodiment. An exemplary process for die attach begins at block 210 with depositing sacrificial material. FIG. 3A is a cross-sectional view illustrating an exemplary packaged integrated circuit after deposition of a sacrificial material according to one embodiment. A sacrificial material 330 is deposited on a die 320. The die 320 may be, for example, silicon, glass, or sapphire. The sacrificial material 330 may be, for example, polyethylene carbonate (PEC) or polypropylene carbonate (PPC). According to one embodiment, the sacrificial material 330 is spun on to the die 320 at a thickness of between 10 and 100 micrometers. In another embodiment, the sacrificial material 330 may be deposited by chemical vapor deposition (CVD). The die 320 having interconnects 322 is placed on a substrate 302 having interconnects 304. According to one embodiment, the interconnects 322 are microbumps for flip chip packaging. According to another embodiment, through silicon stacking with or without through vias may be used for stacking. A flux material 306 between the interconnects 304 and the interconnects 322 holds the die 320 in place before heating. According to one embodiment, the flux material may be rosin-based.

In one embodiment, the sacrificial material 330 has a sublimation temperature above the liquidus temperature of the interconnects 304 and the interconnects 322. For example, the liquidus temperature of eutectic SnPb is approximately 183 degrees Celsius and the liquidus temperature of SAC305 is approximately 221 degrees Celsius.

Figure 3B:
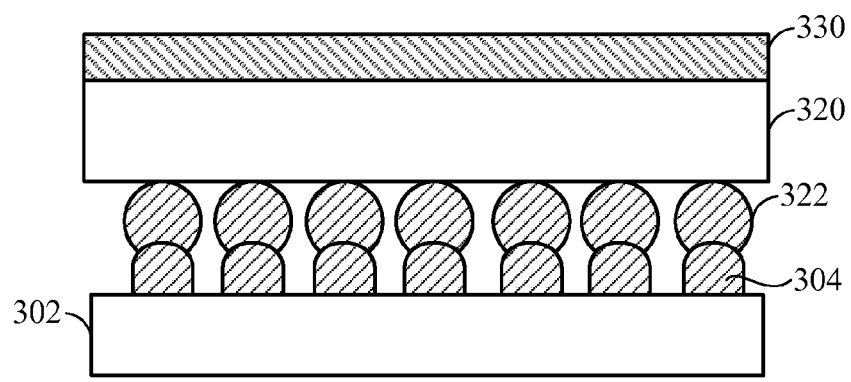
FIG. 3B is a cross-sectional view illustrating an exemplary die after heating to a first temperature according to one embodiment.

The die attach process continues to block 220 and heats the die 320 to a first temperature. FIG. 3B is a cross-sectional view illustrating an exemplary die after heating to a first temperature according to one embodiment. The first temperature may be selected to significantly bond the interconnects 322 with the interconnects 304. During bonding of the interconnects 322, the flux material 306 activates and cleans oxide from the solder surface. At the first temperature, thickness of the sacrificial material 330 is substantially constant and provides support for the die 320 to inhibit warpage.

Figure 3C:
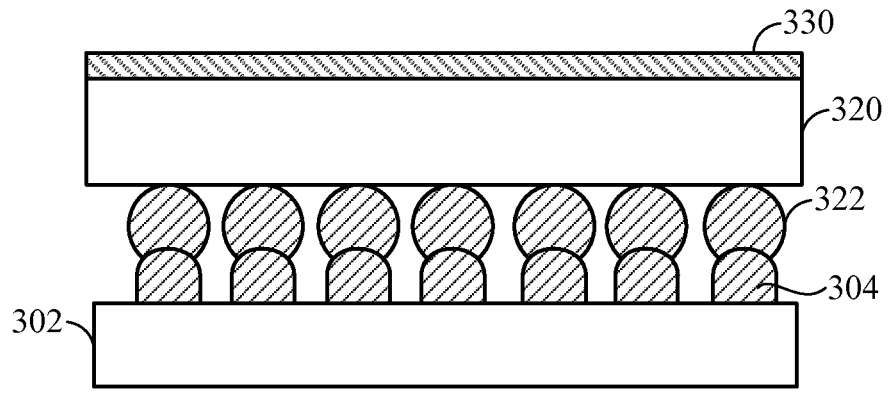
FIG. 3C is a cross-sectional view illustrating an exemplary die after heating to a second temperature according to one embodiment.

After heating the die to the first temperature at block 220, the die is heated to a second temperature at block 230. FIG. 3C is a cross-sectional view illustrating an exemplary die after heating to a second temperature according to one embodiment. At the second temperature, the sacrificial material 330 sublimes resulting in removal of substantially all the sacrificial material 330. According to one embodiment, the second temperature is applied for approximately 45-90 seconds to cause sublimation of the sacrificial material 330. According to another embodiment, the sacrificial material 330 may be partially etched or ground away and a heating process applied to remove remaining residue of the sacrificial material 330.

Figure 3D:
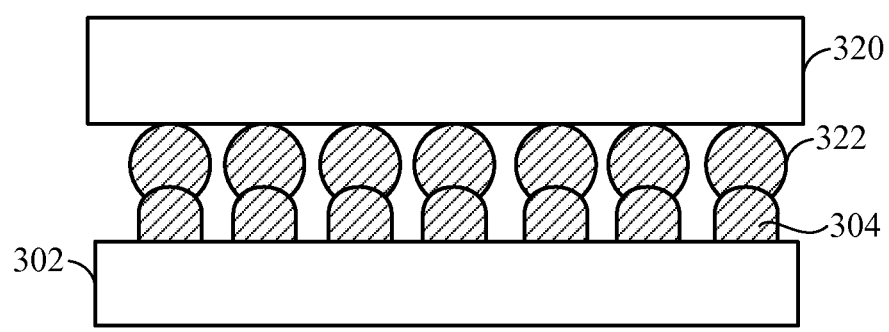
FIG. 3D is a cross-sectional view illustrating an exemplary die after removal of the sacrificial material according to one embodiment.

FIG. 3D is a cross-sectional view illustrating an exemplary packaged integrated circuit after removal of the sacrificial material according to one embodiment. Removal of substantially all of the sacrificial material 330 on the die 320 facilitates good adhesion to subsequent backside die attach material or overmold materials during packaging. Sacrificial material 330 remaining on the die 320 may inhibit bonding of additional materials to the die 320.

Figure 4A:
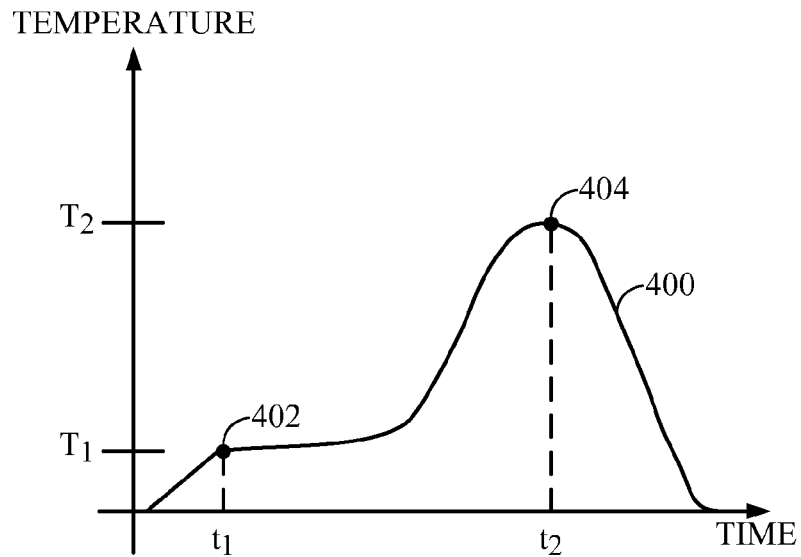
FIG. 4A is a graph illustrating a temperature applied during die attach according to one embodiment.
Figure 4B:
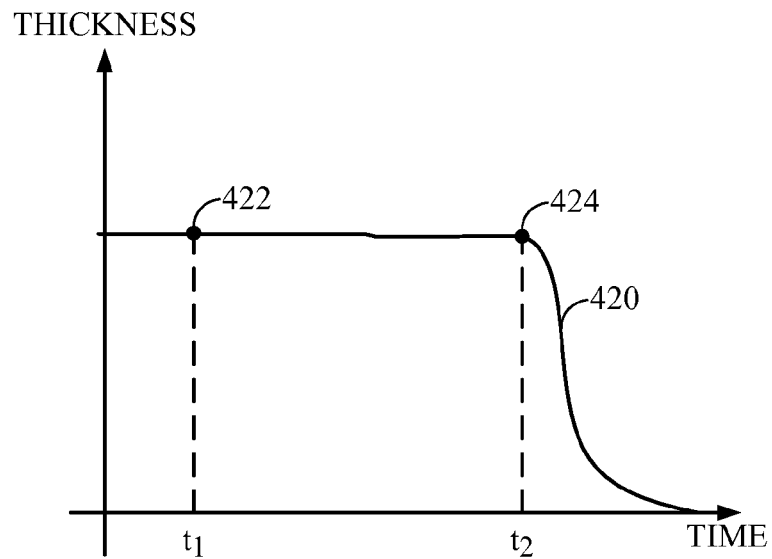
FIG. 4B is a graph illustrating a thickness of a sacrificial material during die attach according to one embodiment.

According to one embodiment, a heating process for die attach of the die 320 to the substrate 302 is described with respect to FIGS. 4A-4B. FIG. 4A is a graph illustrating a temperature applied during die attach according to one embodiment. A line 400 represents the temperature applied to a die during a die attach process. FIG. 4B is a graph illustrating a thickness of a sacrificial material during die attach according to one embodiment. A line 420 represents thickness of a sacrificial material on a die during a die attach process.

At block 220, the die is heated to the first temperature, $T_1$, at a first time, $t_1$, as illustrated by point 402 on the line 400. A thickness of the sacrificial material at the first time, $t_1$, is illustrated as point 422 on the line 420. At the first temperature, $T_1$, interconnects of the die bond to interconnects of the substrate. The first temperature, $T_1$, may be, for example, a liquidus temperature of the interconnects. At the first temperature, the thickness of the sacrificial material is substantially constant as indicated by the point 422 on the line 420.

At block 230, the die is heated to a peak temperature of the process, a second temperature, $T_2$, at a second time, $t_2$, as illustrated by point 404 on the line 400. A thickness of the sacrificial material at the second time, $t_2$, is illustrated as point 424 on the line 420. At the second temperature, $T_2$, the sacrificial material thins until substantially no sacrificial material remains on the die. The second temperature, $T_2$, may be, for example, a decomposition temperature of the sacrificial material.

Although the line 400 is shown as one set of temperature, the line 400 may take on different profiles. For example, the line 400 may be a continuous ramp without local maximums. In one embodiment, a continuous ramp may be used in tape automated bonding (TAB) to sublimate the sacrificial material 330.

A sacrificial material applied to a thin die during die attach provides additional support for the thin die and inhibits warpage of the thin die. After die attach using the sacrificial material, the thin die may be incorporated into an integrated circuit. The sacrificial material may be selected such that the sacrificial material remains substantially the same thickness at temperatures used for bonding of the interconnects, such as solder liquidus temperatures and sublimates at peak temperatures of the die attach process.

A die attach process using the sacrificial material may apply a first temperature for reflow during which the sacrificial material remains substantially the same thickness. The die attach process may apply a second temperature during which the sacrificial material decomposes resulting in removal of substantially all of the sacrificial material. The sacrificial material allows manufacturing using thin dies, such as those below 100 micrometers in thickness, and production of thin electronic devices.

Figure 5:
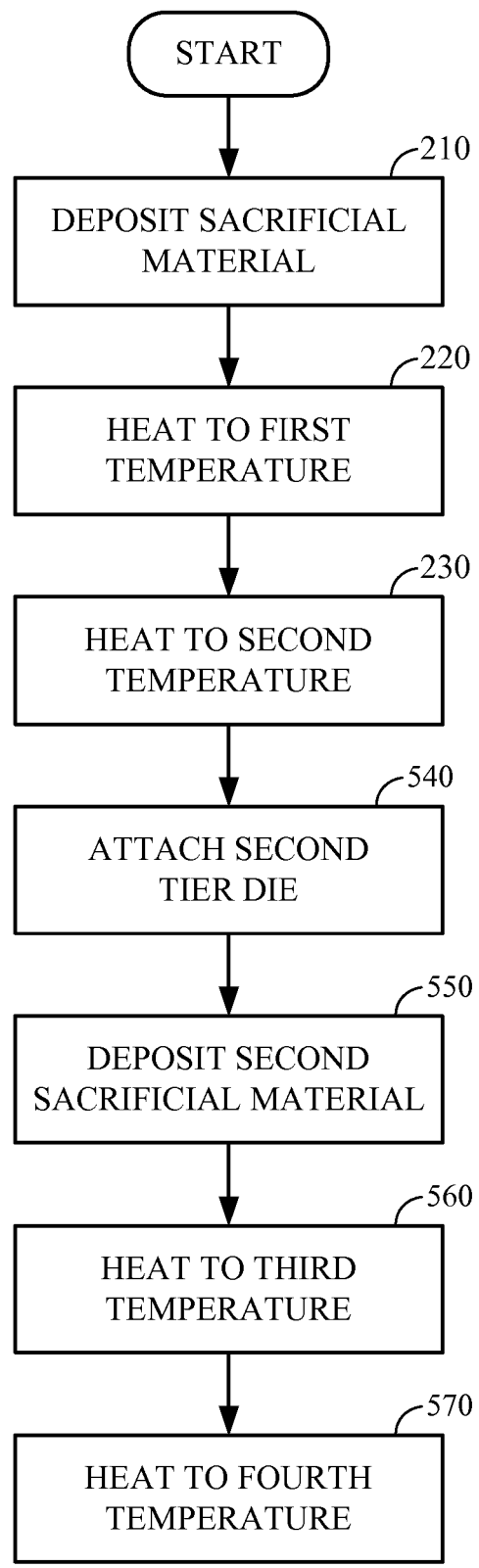
FIG. 5 is a flow chart illustrating an exemplary process flow for die attach with stacked thin dies according to one embodiment.

The die attach process and sacrificial material may also be applied during stacking of dies as illustrated in the flow chart of FIG. 5, which continues from the flow shown in FIG. 2. According to one embodiment, at block 540 a second tier die may be attached to a first tier die with a flux material through a interconnects on the first tier die and the second tier die. At block 550, a second sacrificial material is deposited on the second tier die to inhibit warpage of the second tier die. At block 560, the second tier die is heated to a third temperature causing the interconnects on the second tier die to connect to the interconnects of the first tier die. At block 570, the second tier die is then heated to a fourth temperature causing the sacrificial material to sublimate. According to one embodiment, the third and fourth temperature are equal to the first and second temperature, respectively.

Figure 6:
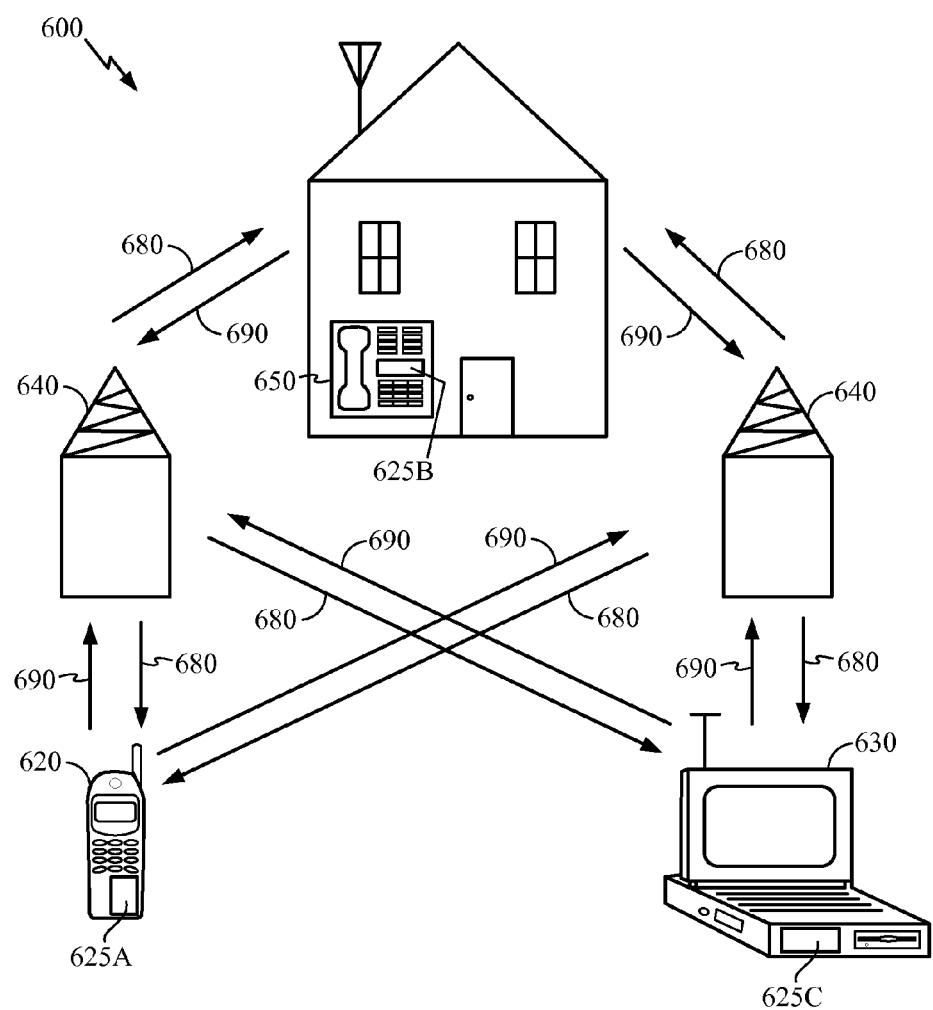
FIG. 6 is a block diagram showing an exemplary wireless communication system in which an embodiment of the disclosure may be advantageously employed.

FIG. 6 shows an exemplary wireless communication system 600 in which an embodiment of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include improved packaged ICs 625A, 625C, and 625B, respectively, which are embodiments as discussed above. FIG. 6 shows forward link signals 680 from the base stations 640 and the remote units 620, 630, and 650 and reverse link signals 690 from the remote units 620, 630, and 650 to base stations 640.

In FIG. 6, the remote unit 620 is shown as a mobile telephone, the remote unit 630 is shown as a portable computer, and the remote unit 650 is shown as a computer in a wireless local loop system. For example, the remote units may be cell phones, hand-held personal communication systems (PCS) units, portable data units such as personal data assistants, fixed location data units such as meter reading equipment, set top boxes, music players, video players, entertainment units, navigation devices, or computers. Although FIG. 6 illustrates remote units according to the teachings of the disclosure, the disclosure is not limited to these exemplary illustrated units. The disclosure may be suitably employed in any device which includes packaged ICs.

Figure 7:
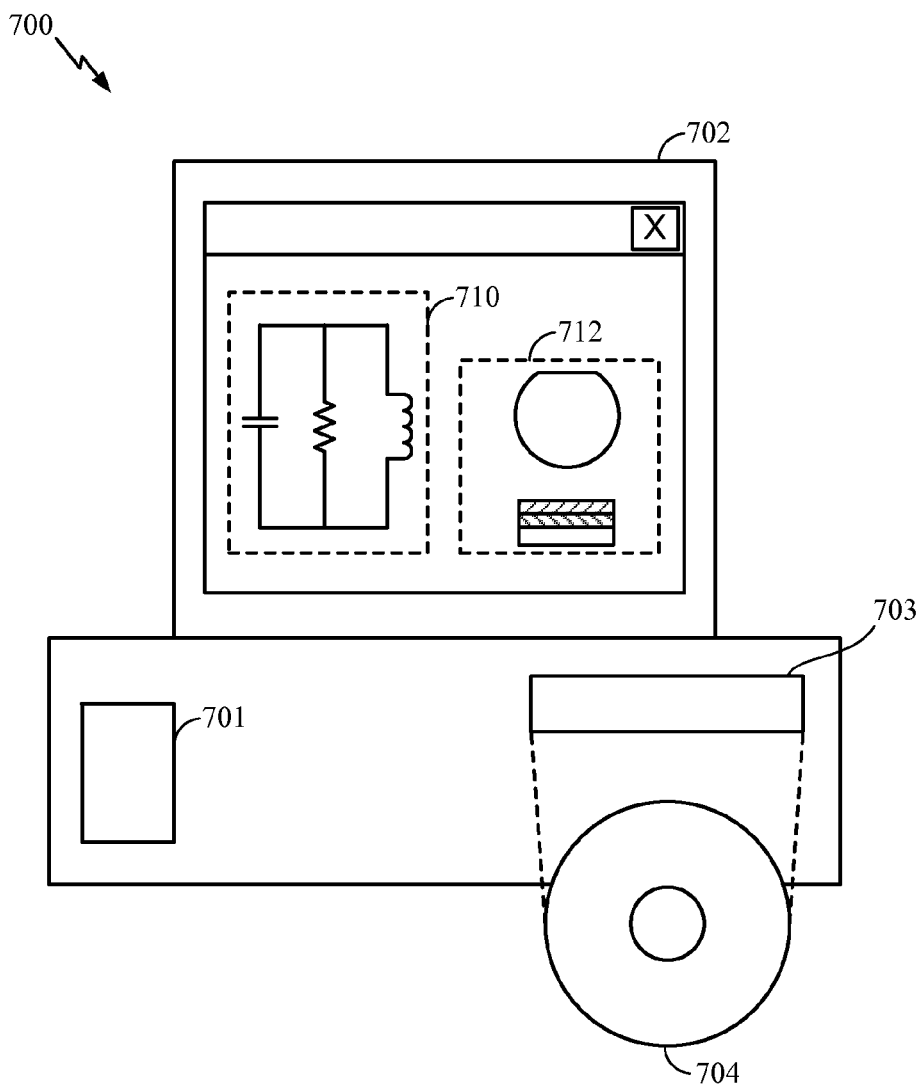
FIG. 7 is a block diagram illustrating a design workstation used for circuit, layout, and logic design of a semiconductor component according to one embodiment.

FIG. 7 is a block diagram illustrating a design workstation used for circuit, layout, and logic design of a die or a circuit implemented on a die as disclosed below. A design workstation 700 includes a hard disk 701 containing operating system software, support files, and design software such as Cadence or OrCAD. The design workstation 700 also includes a display to facilitate design of a circuit 710 or a semiconductor component 712 such as a wafer or die. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of packaging, comprising:
   depositing a sacrificial material on a die;
   attaching a first plurality of interconnects of the die to a second plurality of interconnects of a substrate after depositing the sacrificial material on the die;
   heating the die to a first temperature after depositing the sacrificial material, the first temperature causing the first plurality of interconnects of the die to connect to the second plurality of interconnects of the substrate; and
   heating the die to a second temperature after heating the die to the first temperature, the second temperature causing the sacrificial material to sublime.

2. The method of claim 1, in which attaching the die comprises attaching the first plurality of interconnects of the die to the second plurality of interconnects of the substrate with flux material.

3. The method of claim 1, in which depositing the sacrificial material comprises depositing 10 to 100 micrometers of the sacrificial material.

4. The method of claim 1, in which depositing the sacrificial material comprises depositing polyethylene carbonate and/or polypropylene carbonate.

5. The method of claim 1, in which attaching the die comprises attaching microbumps of the die to the second plurality of interconnects of the substrate.

6. The method of claim 1, in which heating the die to the first temperature comprises heating the die to a liquidus temperature of the first plurality of interconnects.

7. The method of claim 1, in which heating the die to the second temperature comprises heating the die to a decomposition temperature of the sacrificial material.

8. The method of claim 1, further comprising:
   attaching a fourth plurality of interconnects of a second tier die to a third plurality of interconnects of the die with a second flux material;
   depositing the sacrificial material on the second tier die;
   heating the second tier die to a third temperature, the third temperature causing the fourth plurality of interconnects of the second tier die to connect to the third plurality of interconnects of the die; and
   heating the second tier die to a fourth temperature after heating the second tier die to the third temperature, the fourth temperature causing the sacrificial material to sublimate.

9. The method of claim 8, in which the first temperature and the third temperature are substantially equal and the second temperature and the fourth temperature are substantially equal.

10. The method of claim 1, in which attaching comprises performing face-to-face die bonding.

11. The method of claim 1, further comprising integrating the die into a mobile phone, a set top box, a music player, a video player, an entertainment unit, a navigation device, a computer, a hand-held personal communication systems (PCS) unit, a portable data unit, and/or a fixed location data unit.

12. A method of packaging, comprising the steps of:
    depositing a sacrificial material on a die;
    attaching a first plurality of interconnects of the die to a second plurality of interconnects of a substrate after depositing the sacrificial material on the die;
    heating the die to a first temperature after depositing the sacrificial material, the first temperature causing the first plurality of interconnects on the die to connect to the second plurality of interconnects on the substrate; and
    heating the die to a second temperature after heating the die to the first temperature, the second temperature causing the sacrificial material to sublimate.

13. The method of claim 12, in which the step of depositing the sacrificial material comprises depositing polyethylene carbonate and/or polypropylene carbonate.

14. The method of claim 12, in which the step of heating the die to the first temperature comprises heating the die to a liquidus temperature of the first plurality of interconnects, and the step of heating the die to the second temperature comprises heating the die to a decomposition temperature of the sacrificial material.

15. The method of claim 12, in which the step of heating the die to the first temperature does not cause decomposition of the sacrificial material.

16. The method of claim 12, further comprising the step of integrating the die into a mobile phone, a set top box, a music player, a video player, an entertainment unit, a navigation device, a computer, a hand-held personal communication systems (PCS) unit, a portable data unit, and/or a fixed location data unit.

17. An apparatus, comprising:
    a substrate having a first plurality of interconnects;
    a die having a second plurality of interconnects attached to the first plurality of interconnects; and
    a sacrificial layer on a side of the die opposite the second plurality of interconnects, the sacrificial layer having a sublimation temperature above the liquidus temperature of the second plurality of interconnects.

18. The apparatus of claim 17, in which the apparatus is integrated into a mobile phone, a set top box, a music player, a video player, an entertainment unit, a navigation device, a computer, a hand-held personal communication systems (PCS) unit, a portable data unit, and/or a fixed location data unit.

19. An apparatus, comprising:
a substrate having a first plurality of interconnects;
a die having a second plurality of interconnects attached to the first plurality of interconnects; and
means for reducing warpage on a side of the die opposite the second plurality of interconnects, the warpage reducing means having a sublimation temperature above the liquidus temperature of the second plurality of interconnects.

20. The apparatus of claim 19, in which the apparatus is integrated into at least one of a mobile phone, a set top box, a music player, a video player, an entertainment unit, a navigation device, a computer, a hand-held personal communication systems (PCS) unit, a portable data unit, and a fixed location data unit.

* * * * *